United States Patent
Lee et al.

(10) Patent No.: US 8,598,781 B2
(45) Date of Patent: Dec. 3, 2013

(54) ORGANIC LIGHT EMITTING DISPLAY (OLED) AND ITS METHOD OF FABRICATION

(75) Inventors: Hun-Jung Lee, Suwon-si (KR);
Jae-Kyeong Jeong, Suwon-si (KR);
Steve Y. G. Mo, Suwon-si (KR)

(73) Assignee: Samsung Display Co., Ltd.,
Giheung-Gu, Yongin, Gyeonggi-Do (KR)

( * ) Notice: Subject to any disclaimer, the term of this patent is extended or adjusted under 35 U.S.C. 154(b) by 748 days.

(21) Appl. No.: 12/315,000

(22) Filed: Dec. 19, 2008

(65) Prior Publication Data

US 2009/0251047 A1    Oct. 8, 2009

(30) Foreign Application Priority Data

Apr. 7, 2008 (KR) .................. 10-2008-0032081

(51) Int. Cl.
*H01L 51/50* (2006.01)
(52) U.S. Cl.
USPC .............................. 313/504; 313/506; 445/24
(58) Field of Classification Search
USPC ......................................................... 313/503
See application file for complete search history.

(56) References Cited

U.S. PATENT DOCUMENTS

| | | | |
|---|---|---|---|
| 2006/0091785 A1* | 5/2006 | Lee et al. | 313/498 |
| 2006/0145146 A1* | 7/2006 | Suh et al. | 257/40 |
| 2006/0214252 A1* | 9/2006 | Hirai et al. | 257/462 |
| 2007/0134832 A1* | 6/2007 | Oh et al. | 438/30 |
| 2007/0187678 A1* | 8/2007 | Hirao et al. | 257/43 |

FOREIGN PATENT DOCUMENTS

| | | |
|---|---|---|
| JP | 2007-081362 | 3/2007 |
| KR | 1019990088592 A | 5/1998 |
| KR | 10-1999-0065891 | 8/1999 |
| KR | 1020050023012 | 3/2005 |
| KR | 10-0646975 | 11/2006 |
| KR | 1020070056626 | 6/2007 |
| KR | 1020070116053 | 12/2007 |

OTHER PUBLICATIONS

Machine translation of KR 10-2005-0023012.*
Transmitter letter and Korean Office action issued by Korean Patent Office on Nov. 30, 2009 corresponding to Korean Priority Application No. 10-2008-0032081.
Office action from Korean Patent Office issued in Applicant's corresponding Korean Patent Application No. 10-2008-0032081 dated May 30, 2009.

* cited by examiner

*Primary Examiner* — Britt D Hanley
(74) *Attorney, Agent, or Firm* — Robert E. Bushnell, Esq.

(57) ABSTRACT

An Organic Light Emitting Display (OLED) and a method of fabricating the OLED includes: a substrate including a pixel region and a non-pixel region; a gate electrode arranged in the non-pixel region of the substrate; a first insulating layer arranged on the substrate having the gate electrode formed thereon, and having an open groove on an upper surface of a region opposite to the gate electrode; a semiconductor layer buried in the groove and including a source region, a channel region and a drain region; and an organic thin film layer arranged in the pixel region of the substrate. A common electrode is arranged between the drain region of the semiconductor layer and the organic thin film layer to electrically couple the drain region to the organic thin film layer.

9 Claims, 3 Drawing Sheets

ORGANIC LIGHT EMITTING DISPLAY (OLED) AND ITS METHOD OF FABRICATION

CLAIM OF PRIORITY

This application makes reference to, incorporates the same herein, and claims all benefits accruing under 35 U.S.C. §119 from an application for ORGANIC LIGHT EMITTING DISPLAY DEVICE AND METHOD OF FABRICATING THE SAME earlier filed in the Korean Intellectual Property Office on 7 Apr. 2008 and there duly assigned Serial No. 10-2008-0032081.

BACKGROUND OF THE INVENTION

1. Field of the Invention

The present invention relates to an Organic Light Emitting Display (OLED) and its method of fabrication, and more particularly, the present invention relates to an OLED and its method of fabrication using fewer masks.

2. Description of the Related Art

In general, a Thin Film Transistor (TFT) includes a semiconductor layer including a gate electrode, source and drain regions formed on the gate electrode, a channel region disposed between the source and drain regions; and source and drain electrodes that come in contact with the source and drain regions of the semiconductor layer.

The semiconductor layer of the TFT configured as described above is generally formed of amorphous silicon or poly-silicon. If the semiconductor layer is formed of amorphous silicon, mobility is low so that it is difficult for a driving circuit to operate at a high speed. On the other hand, if the semiconductor layer is formed of poly-silicon, mobility is high whereas a threshold voltage is non-uniform. Therefore, a separate compensating circuit must be added.

In a conventional method of fabricating a TFT using Low Temperature Poly-Silicon (LTPS), a high-cost process, such as a laser heating treatment, is needed, and it is not easy to control characteristics. Therefore, it is difficult to apply the conventional method of fabricating a TFT using LTPS to a large-area substrate.

In order to solve these problems, studies for using an oxide semiconductor as a semiconductor layer have been recently conducted.

Japanese Patent Publication No. 2004-273614 teaches a TFT using an oxide semiconductor, which is made of zinc oxide (ZnO) or includes ZnO as a main element, as a semiconductor layer.

However, if such a TFT is applied to an OLED, the following processes are added. In order to planarize a substrate on which a TFT is disposed, a planarization layer must be formed on the entire surface of the substrate on which the TFT is disposed. Furthermore, in order to electrically connect the TFT to the OLED, a contact hole is be formed on the planarization layer. Therefore, processes of fabricating an OLED may be complicated, and the number of processes using a mask may be increased.

SUMMARY OF THE INVENTION

Accordingly, it is an object of the present invention to provide an Organic Light Emitting Display (OLED) and its method of fabrication that uses fewer masks in fabricating the OLED.

According to an aspect of the present invention, an Organic Light Emitting Display (OLED) includes: a substrate including a pixel region and a non-pixel region; a gate electrode arranged in the non-pixel region of the substrate; a first insulating layer arranged on the substrate having the gate electrode formed thereon, and having an open groove on an upper surface of a region opposite to the gate electrode; a semiconductor layer buried in the groove and including a source region, a channel region and a drain region; and an organic thin film layer arranged in the pixel region of the substrate. A common electrode is arranged between the drain region of the semiconductor layer and the organic thin film layer to electrically couple the drain region to the organic thin film layer.

The common electrode may be electrically coupled to a drain electrode of the semiconductor layer and extend to the pixel region of the substrate. The semiconductor layer may be zinc oxide (ZnO). The semiconductor layer may be doped with at least one of indium (In), gallium (Ga) or stannum (Sn). The first insulating layer may be at least one material selected from the group consisting of polyimide, polyacryl, photoresist and benzocyclobutene (BCB).

According to another aspect of the present invention, a method of fabricating an Organic Light Emitting Display (OLED) includes: dividing a substrate into a pixel region and a non-pixel region; forming a gate electrode in the non-pixel region of the substrate; forming a first insulating layer on the entire surface of the substrate having the gate electrode formed thereon; patterning the first insulating layer to form a groove in a region opposite to the gate electrode; forming a semiconductor layer buried in the groove and including a source region, a channel region and a drain region; forming a source electrode in contact with the source region of the semiconductor layer; forming a common electrode in contact with the drain region of the semiconductor layer and extending to the pixel region of the substrate; and forming an organic thin film layer on the common electrode.

The semiconductor layer may be formed using any one of lift-off, inkjet and etching methods. The lift-off method of forming the semiconductor layer may include: coating a photoresist on the entire surface of the first insulating layer having the groove formed therein; removing the photoresist coated on the groove; coating a semiconductor material on the groove and the photoresist; and removing the photoresist. The inkjet method of forming the semiconductor layer may be performed by disposing a semiconductor material in the groove.

As described above, according to the present invention, a drain electrode and an anode electrode share a common electrode, so that the number of masks used to fabricate an OLED can be decreased. Accordingly, productivity of the OLED is improved, and a process margin can be secured.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicated the same or similar components, wherein.

DETAILED DESCRIPTION OF THE INVENTION

Figure 1:
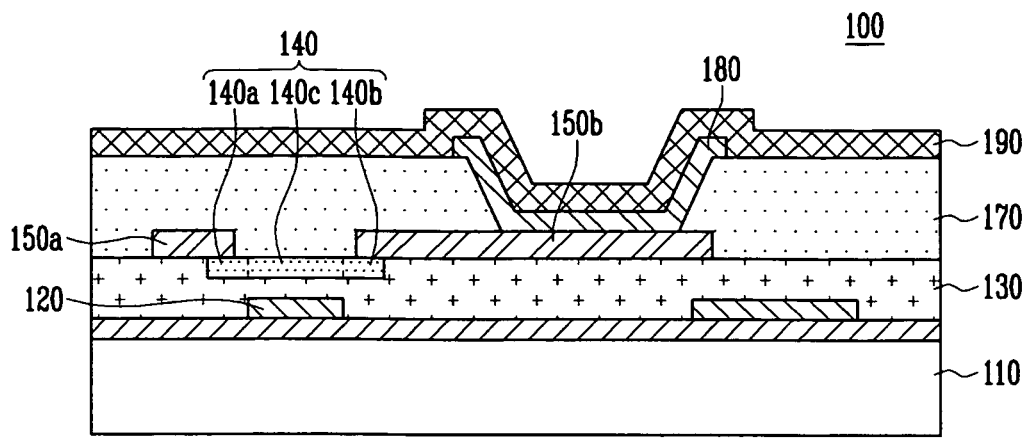
FIG. 1 is a cross-sectional view of an OLED according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the element or be indirectly on the element with one or more intervening elements interposed therebetween. Also, when an element is referred to as being "connected to" another element, it can be directly connected to the element or be indirectly connected to the element with one or more intervening elements interposed therebetween. Hereinafter, like reference numerals refer to like elements.

FIG. 1 is a cross-sectional view of an OLED according to an embodiment of the present invention.

Referring to FIG. 1, the OLED 100 includes a bottom-gate-type thin film transistor (TFT) and an organic light emitting device electrically coupled to the TFT.

Generally, an OLED includes a TFT having a gate electrode, a semiconductor layer, and source/drain electrodes, and an anode electrode coupled to the drain electrode of the TFT. In an OLED with such a structure, a via hole is formed to connect the drain electrode of the TFT to the anode electrode. However, a separate mask is used to form a via hole. In this embodiment, the number of masks is decreased by eliminating a process of forming a via hole.

A substrate 110 has a non-pixel region in which the TFT is disposed and a pixel region in which the organic light emitting device electrically coupled to the TFT is disposed. A gate electrode 120 is disposed in the non-pixel region of the substrate 110. A first insulating layer 130 is disposed on the entire surface of the substrate 110 where the gate electrode 120 is disposed. The first insulating layer 130 has a groove 145 (see FIG. 2A) opened on an upper surface of a region opposite to the gate electrode 120. The first insulating layer 130 insulates the gate electrode 120 from a semiconductor layer 140 and planarizes the substrate 110 having the gate electrode 120 and the semiconductor layer 140. The first insulating layer 130 may be formed of an organic layer, and may include a material selected from the group consisting of polyimide, polyacryl, photoresist, and benzocyclobutene (BCB).

The semiconductor layer 140 is buried in the groove 145 to be exposed to a surface of the first insulating layer 130. As such, the structure in which the semiconductor layer 140 is buried in the first insulating layer 130 is referred to as an "embedded structure". The semiconductor layer 140 includes a source region 140a, a drain region 140b and a channel region 140c disposed between the source and drain regions 140a and 140b. The channel region 140c of the semiconductor layer 140 is formed at the same position opposite to the gate electrode 120. As such, the semiconductor layer 140 is buried in the groove 145 of the first insulating layer 130 to planarize the top surface of the insulating layer 130. That is, in other OLEDs, a first insulating layer is formed to insulate a gate electrode from a semiconductor layer, and a second insulating layer is formed to planarize a substrate where a TFT is disposed. However, in this embodiment, the gate electrode 120 and the semiconductor layer 140 are insulated from each other using the first insulating layer 130. Accordingly, in the OLED in accordance with an embodiment of the present invention, the substrate 110 where the TFT is disposed is planarized, so that the number of insulating layers can be decreased by one as compared with that of insulating layers in other OLEDs.

The semiconductor layer 140 may be formed of a semiconductor material using zinc oxide (ZnO) as a main component. Alternatively, the semiconductor layer 140 may be formed of a semiconductor layer in which zinc oxide (ZnO) is doped with an ion material, such as indium (In), gallium (Ga) or stannum (Sn), e.g., InZnO (IZO), GaInZnO (GIZO) or the like. As such, the semiconductor layer 140 is formed of an oxide semiconductor using zinc oxide (ZnO) as a main component to provide a TFT with improved mobility, uniformity and reliability than a conventional TFT formed of amorphous silicon or poly-silicon. Furthermore, if the semiconductor layer 140 is formed of an oxide semiconductor layer, a process of forming the semiconductor layer 140 can be performed at a low temperature of 300 degrees or less using available Low Temperature Poly-Silicon (LTPS) equipment.

A source electrode 150a electrically coupled to the source region 140a of the semiconductor layer 140 and a common electrode 150b electrically coupled to the drain region 140b of the semiconductor layer 140 are disposed on the first insulating layer 130 having the semiconductor layer 140. The common electrode 150b is extended from the non-pixel region to the pixel region. The common electrode 150b is in contact with the drain region 140b of the semiconductor layer 140 and an organic thin film layer 180 so that the semiconductor layer 140 is electrically coupled to the organic thin film layer 180. As such, in this embodiment, the semiconductor 140 is electrically coupled to the organic thin film layer 180 using the common electrode 150b, so that the number of masks used for forming contact holes is decreased. That is, a contact hole is generally formed in a planarized layer disposed between a drain electrode and an anode electrode so that a semiconductor layer is electrically coupled to an organic thin film layer. In this embodiment, however, the drain electrode and the anode electrode are formed as one electrode (the common electrode 150b), so that fewer masks are used to form contact holes.

A second insulating layer 170 is disposed on the entire surface of the first insulating layer 130 having the common electrode 150b formed thereon. The second insulating layer 170 includes an opening that allows the common electrode 150b to be partially exposed. The organic thin film layer 180 is disposed on the common electrode 150b exposed through the opening and the second insulating layer 170. The organic thin film layer 180 is disposed in the pixel region. A cathode electrode 190 is disposed on the organic thin film layer 180 and the second insulating layer 170. The common electrode 150b is formed of a material selected from the group consisting of Indium Tin Oxide (ITO), Indium Zinc Oxide (IZO), Indium Zinc Tin Oxide (IZTO), Indium Cesium Oxide (ICO) and Indium Tungsten Oxide (IWO), so that light can be emitted transparently or through the rear of the OLED 100.

FIGS. 2A to 2F are cross-sectional views of a method of fabricating an OLED according to an embodiment of the present invention.

Figure 2A:
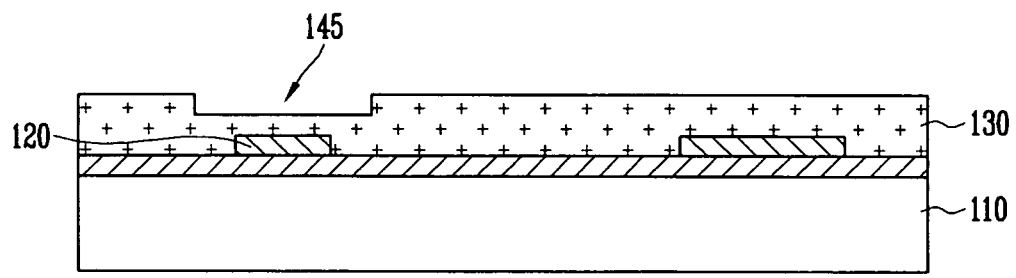
FIGS. 2A to 2F are cross-sectional views of a method of fabricating an OLED according to an embodiment of the present invention.

Referring to FIG. 2A, a metallic material is deposited on a substrate 110, and a gate electrode 120 is formed through a mask process.

The mask process is a photolithography process. The mask process refers to a process of coating a photoresist on a thin film in which a pattern is to be formed, exposing the photoresist to ultraviolet light using a mask to have a desired thin-film shape, etching the exposed coated photoresist, and then removing the photoresist.

A first insulating layer 130 is formed by coating an organic material on the entire surface of the substrate 110 having the gate electrode 120 formed thereon, thereby forming a first insulating layer 130. The organic material is a material selected from the group consisting of polyimide, polyacryl, photoresist, and benzocyclobutene (BCB). A groove 145 is formed through a mask process so as to bury a semiconductor layer 140 (see FIG. 2E) on a top surface of the first insulating layer 130. The groove 145 is formed on the top surface of the first insulating layer 130 opposite to the gate electrode 120.

Figure 2B:
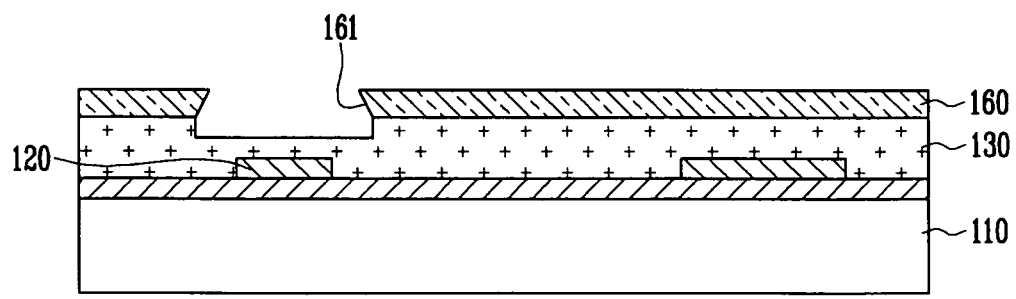

Referring to FIG. 2B, a photoresist 160 is coated on the entire surface of the first insulating layer having the groove 145 formed therein, and the photoresist 160 with different heights is then formed through an exposure process using a half-tone mask or dummy diffraction mask. Specifically, the photoresist 160 formed on the groove 145 is totally exposed using a half-tone mask, and the photoresist 160 formed on the first insulating layer 130 is exposed to a depth corresponding to the height of the groove 145. Therefore, the groove 145 is exposed to the outside, and the photoresist 160 remains on the first insulating layer 130. Furthermore, the photoresist 160 adjacent to the groove 145 has an undercut shape to prevent a semiconductor material from being coated on a side surface 161 of the photoresist adjacent to the groove 145.

Figure 2C:
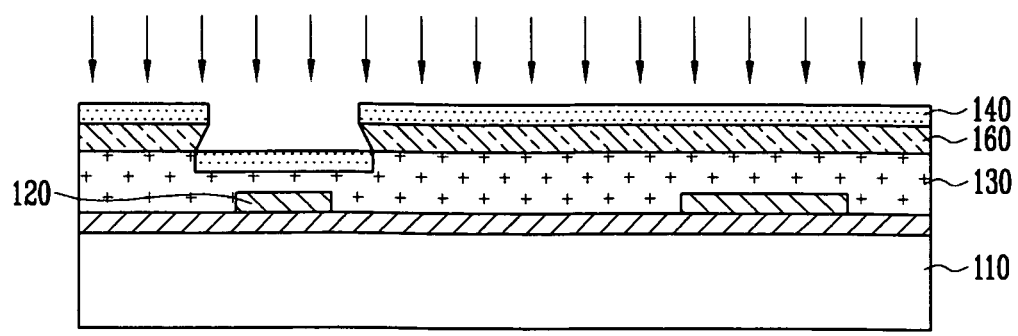

Referring to FIG. 2C, a semiconductor material is coated on the entire surface of the groove 145 and the photoresist 160 so as to bury the semiconductor layer 140 in the groove 145. The semiconductor material is either zinc oxide (ZnO) or zinc oxide (ZnO) doped with at least one of indium (In), gallium (Ga) and stannum (Sn). Thus, the semiconductor layer 140 is formed on the entire surface of the groove 145 and the photoresist 160.

Figure 2D:
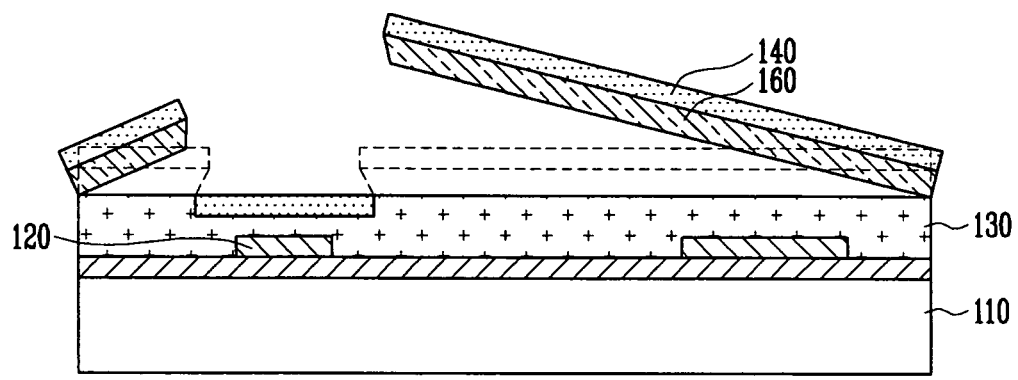

Referring to FIG. 2D, the photoresist 160 is lifted off from the first insulating layer 130, and therefore the first insulating layer 130 and the semiconductor layer 140 buried in the groove 145 are exposed to the outside.

Figure 2E:
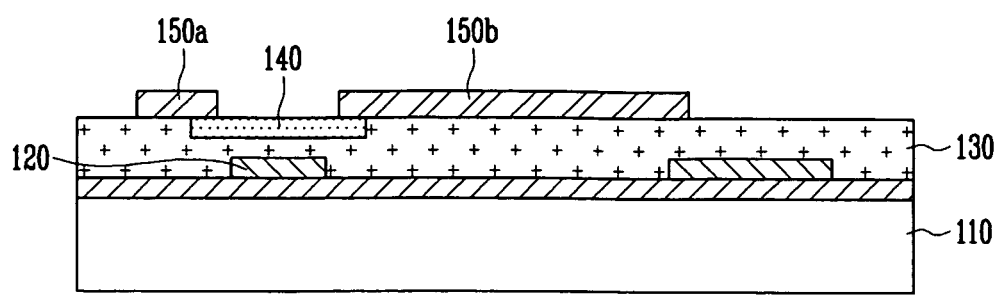

Referring to FIG. 2E, a metallic material is deposited on the entire surface of the first insulating layer 130 having the semiconductor layer 140, and source and common electrodes 150a and 150b that are respectively in contact with source and drain regions 140a and 140b (see FIG. 2F) of the semiconductor layer 140 are then formed through a mask process. The common electrode 150b is patterned to extend to the pixel region so that the common electrode 150b is in contact with an organic thin film layer 180.

Figure 2F:
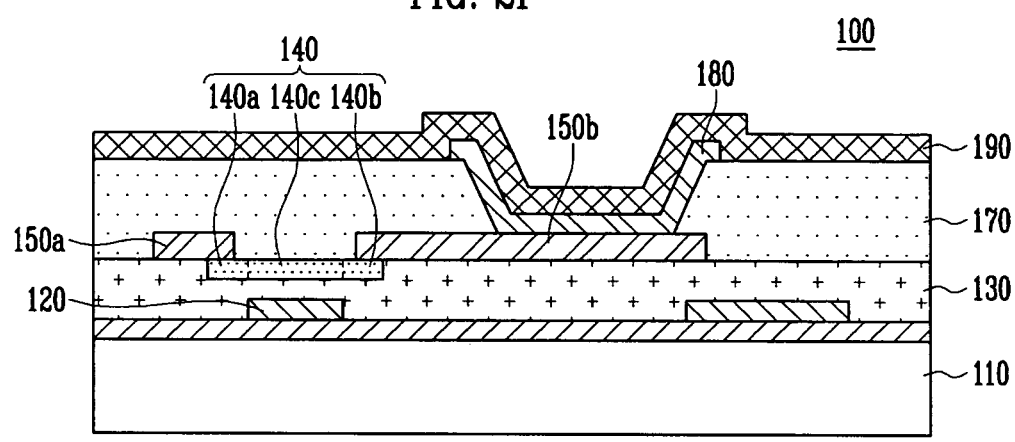

Referring to FIG. 2F, a second insulating layer 170 is formed on the entire surface of the first insulating layer 130 where the source and common electrodes 150a and 150b are formed. A mask process is performed with respect to the second insulating layer 170 so that the common electrode 150b disposed in the pixel region is partially exposed. The method of performing the mask process is the same as the method described above. The organic thin film layer 180 is formed on the common electrode 150b exposed through the mask process and the second insulating layer 170. A cathode electrode 190 is formed on the organic thin film layer 180 and the second insulating layer 170.

In the aforementioned embodiment, the semiconductor layer has been formed through a lift-off method. However, the semiconductor layer 140 may be formed using an inkjet method and an etching method. The inkjet method is performed by disposing a semiconductor material in the groove 145. The number of processes when forming the semiconductor layer 140 using the inkjet method is less than the number of processes when forming the semiconductor layer 140 using the lift-off method.

While the present invention has been described in connection with certain exemplary embodiments, it is to be understood that the present invention is not limited to the disclosed embodiments, but, on the contrary, is intended to cover various modifications and equivalent arrangements included within the spirit and scope of the appended claims.

What is claimed is:

1. An Organic Light Emitting Display (OLED) comprising:
    a substrate including a pixel region and a non-pixel region;
    a gate electrode arranged in the non-pixel region of the substrate;
    a first insulating layer arranged on the substrate where the gate electrode is formed, and having an open groove on an upper surface of a region opposite to the gate electrode, said insulating layer in direct contact with the gate electrode and substrate;
    a semiconductor layer buried in the groove and including a source region, a channel region, and a drain region; and
    an organic thin film layer arranged in the pixel region of the substrate; and
    a common electrode arranged between the drain region of the semiconductor layer and the organic thin film layer to electrically couple the drain region to the organic thin film layer, and the common electrode directly making contact with the drain region of the semiconductor layer.

2. The OLED as claimed in claim 1, wherein the common electrode is electrically coupled to the drain region of the semiconductor layer and extends to the pixel region of the substrate.

3. The OLED as claimed in claim 1, wherein the semiconductor layer comprises zinc oxide (ZnO).

4. The OLED as claimed in claim 3, wherein the semiconductor layer is doped with at least one of indium (In), gallium (Ga) or stannum (Sn).

5. The OLED as claimed in claim 1, wherein the first insulating layer is at least one material selected from the group consisting of polyimide, polyacryl, photoresist, and benzocyclobutene (BCB).

6. A method of fabricating an Organic Light Emitting Display (OLED), the method comprising:
    dividing a substrate into a pixel region and a non-pixel region;
    forming a gate electrode in the non-pixel region of the substrate;
    forming a first insulating layer on an entire surface of the substrate where the gate electrode is formed, said insulating layer in direct contact with the gate electrode and substrate;
    patterning the first insulating layer to form a groove in a region opposite to the gate electrode;
    forming a semiconductor layer buried in the groove and including a source region, a channel region and a drain region;
    forming a source electrode in contact with the source region of the semiconductor layer;
    forming a common electrode directly making contact with the drain region of the semiconductor layer and extending to the pixel region of the substrate; and
    forming an organic thin film layer on the common electrode.

7. The method as claimed in claim 6, wherein the semiconductor layer is formed by any one of lift-off, inkjet and etching methods.

8. The method as claimed in claim 7, wherein the lift-off method of forming the semiconductor layer comprises:
    coating a photoresist on an entire surface of the first insulating layer where the groove is formed;
    removing the photoresist coated on the groove;
    coating a semiconductor material on the groove and the photoresist; and
    removing the photoresist.

9. The method as claimed in claim 7, wherein the inkjet method of forming the semiconductor layer is performed by disposing a semiconductor material in the groove.

* * * * *